United States Patent [19]

Nanya et al.

[11] 4,249,246

[45] Feb. 3, 1981

[54] PROGRAMMABLE LOGIC ARRAY FOR GENERATING EOR SUMS OF INPUT SIGNALS

[75] Inventors: Takashi Nanya; Takeo Tanaka, both of Tokyo, Japan

[73] Assignee: Nippon Electric Co., Ltd., Tokyo, Japan

[21] Appl. No.: 15,841

[22] Filed: Feb. 27, 1979

[30] Foreign Application Priority Data

Feb. 27, 1978 [JP] Japan .................................. 53-22663
May 19, 1978 [JP] Japan .................................. 53-60262

[51] Int. Cl.$^3$ .......................................... H03K 19/20
[52] U.S. Cl. ................................................. 364/716
[58] Field of Search ................ 364/716; 307/207, 216; 340/166 R

[56] References Cited

U.S. PATENT DOCUMENTS

3,974,366  8/1976  Hebenstreit .......................... 364/716
3,987,286  10/1976  Muehldorf ........................... 364/716

OTHER PUBLICATIONS

Varadarajan, "Universal Logic Array", *IBM Tech. Disclosure Bulletin* vol. 20, No. 1, Jun. 1977, pp. 189–190.

*Primary Examiner*—David H. Malzahn
*Attorney, Agent, or Firm*—Sughrue, Rothwell, Mion, Zinn and Macpeak

[57] ABSTRACT

A programmable logic array (PLA) is achieved by taking various EOR sums of programmable AND term generator output signals. The EOR term generator receives externally applied logic constant signals on respective logic constant signal lines. Each logic constant signal line is coupled to the AND term generator outputs by a plurality of EOR elements which are either connected in series and controlled by different AND terms or cascaded in tree-like fashion.

4 Claims, 5 Drawing Figures

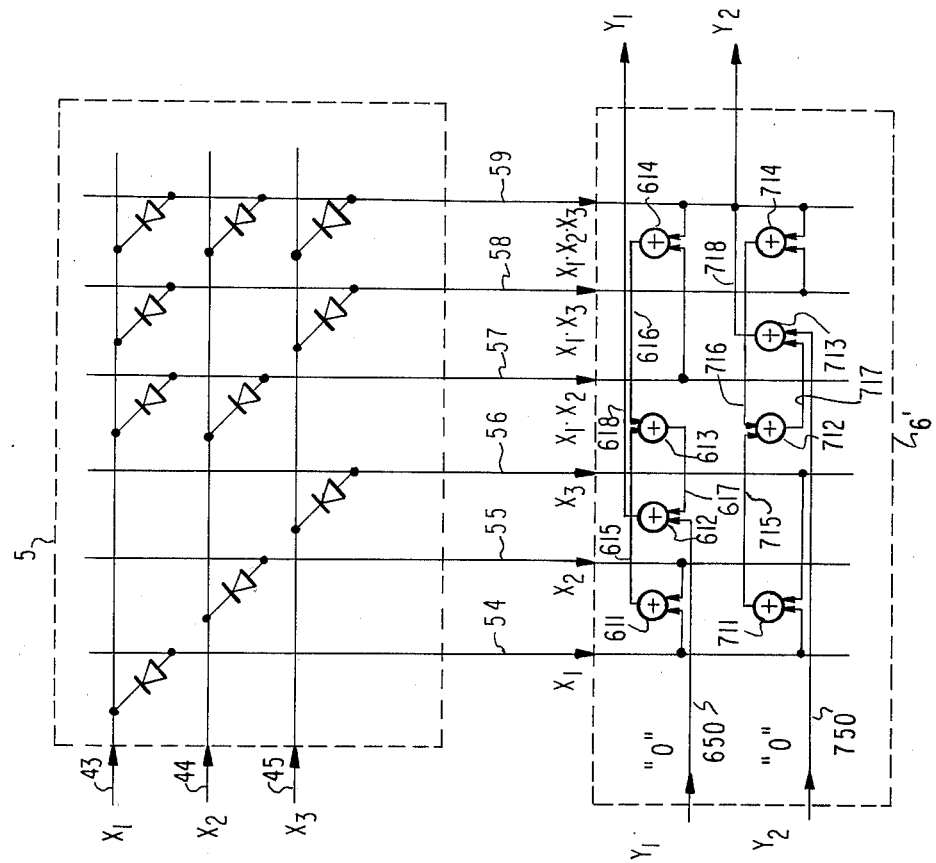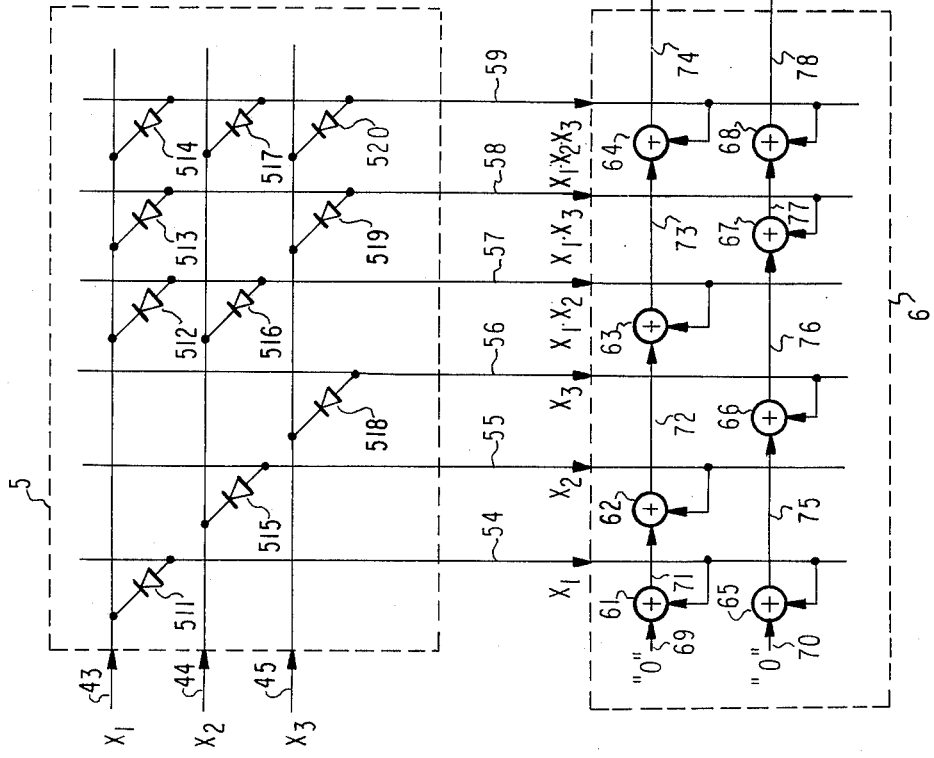

PROGRAMMABLE LOGIC ARRAY FOR GENERATING EOR SUMS OF INPUT SIGNALS

BACKGROUND OF THE INVENTION

The present invention relates to a semiconductor integrated logic circuit and, more particularly, to a programmable logic array whose structural elements can be easily tested for correct operation.

As a result of the marked increase in the integration density in semiconductor circuit devices, which has made it possible to form a vast number of circuit elements in a single semiconductor chip, there has been an increasing demand for greater versatility and function varieties for circuits formed in such semiconductor chips as well as for the adaptability to mass production. One of the integrated circuits developed to meet these requirements is a programmable logic array (PLA) which is comprised of a logical product (AND) term generator and a logical sum (OR) term generator. The AND term generator is an AND array including a plurality of AND elements arrayed in a matrix, while the OR term generator is an OR array including a plurality of OR elements arrayed in a matrix so connected to the AND array as to take an OR operation of a given combination of the output signals from the AND array.

Such a PLA is disclosed, for example, in the U.S. Pat. Nos. 3,566,153 and 3,702,985. The above-mentioned PLA is programmable so that any user may assemble a desired random logic by the use of a single fabrication mask, giving high flexibility in use and attaining excellent mass production allowing the mask patterns to be standardized. However, such a PLA has the disadvantage in that a greater amount of test data for testing the structural elements used is needed with the improvement of the integration density. More particularly, when any one of the AND elements of the PLA is defective, the output signal of the AND gate is "0". For this reason, the defective element is readily detected. On the other hand, when any one of the OR elements is defective, the output signal of the OR array as a whole is "1". As a result, the detection of the defective OR element becomes difficult, requiring a great amount of test data and test time.

SUMMARY OF THE INVENTION

An object of the present invention is therefore to provide a PLA in which the testing of the correct operation of the structural elements used is easily accomplished.

One of the major features of the present invention lies in that an Exclusive OR (EOR) term generator, comprised of an EOR array including a plurality of EOR elements arranged in a matrix, is used in place of the OR term generator mentioned above.

More specifically, the present PLA comprises an AND term generator having row and column lines arranged on a semi-conductor surface in row and column directions and a plurality of AND elements at the intersections of said row and column lines, with an arrangement to allow input digital signals to be introduced therein from said row lines and output digital signals to be taken therefrom through said column lines, whereby it is programmable to achieve a given function; and an Exclusive OR term generator having a plurality of constant signal lines connecting to said column lines of said AND generator so as to produce in the row direction logic constant signals delivered externally and having a plurality of Exclusive OR elements which are connected between said logic constant signal lines and the column lines of said AND generator.

In one embodiment, the EOR elements are arranged in series on the constant signal lines with each receiving as one input the output from a previous EOR element and as its other input one of the AND generator output lines. In a second embodiment, a set of first EOR elements take the EOR of different pairs of AND generator output lines, a second of second EOR elements take the EOR of pairs of outputs from the first EOR elements, and a set of third EOR elements take the EOR of the constant signal lines and the second EOR outputs.

Other objects and features of the invention will be apparent from the following description taken in conjunction with the accompanying drawings, in which:

BRIEF DESCRIPTION OF THE DRAWINGS

FIG. 4 shows a detailed circuit diagram of the present PLA illustrating the distinction between the present invention and the PLA shown in FIG. 3; and FIG. 5 shows a circuit diagram of another embodiment of the present invention.

DESCRIPTION OF THE PREFERRED EMBODIMENTS

Figure 1:
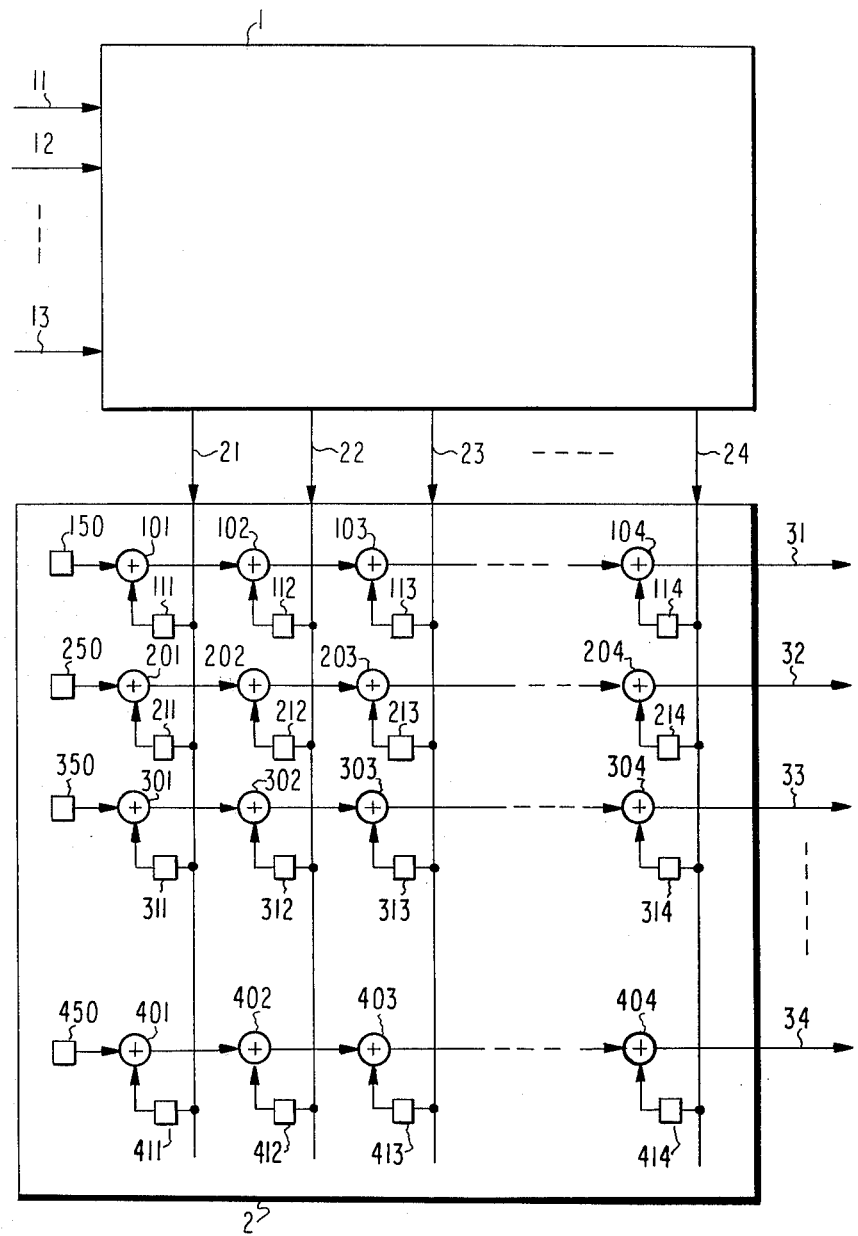
FIG. 1 shows a circuit diagram of one embodiment of the invention.
Figure 3:
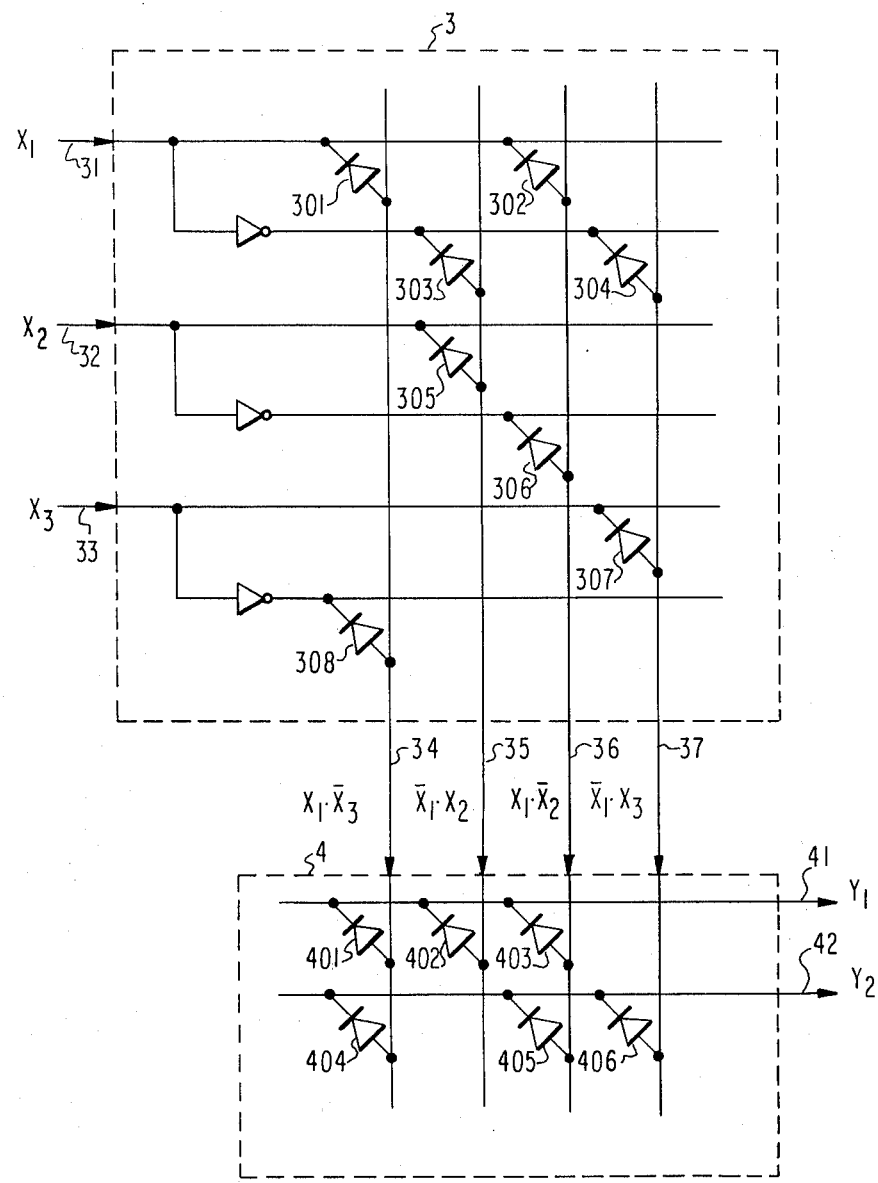
FIG. 3 shows a circuit diagram of a part of a conventional PLA circuit.

Referring to FIG. 1, the present PLA includes an AND array 1 and an EOR array 2. The AND array 1 includes a number of diodes (301 to 308 of FIG. 3) arrayed in matrix with a plurality of row lines 11 to 13 connecting the related diodes in the row direction and a plurality of column lines 21 to 24 connecting the related diodes in the column direction. The AND array is programmable to achieve a given function in a well known manner. In the EOR array 2, a plurality of switching elements 111, 211, 311 and 411 are connected to the column line 21. Similarly, switching elements 112, 212, 312 and 412 are connected to the column line 22; switching elements 113, 213, 313 and 413, to the column line 23; and switching elements 114, 214, 314 and 414, to the column line 24. EOR elements 101 to 104, 201 to 204, 301 to 304, and 401 to 404, each having two inputs and one output, are arranged in the row direction and coupled with output signal lines 31 to 34, respectively. A plurality of logic constant elements 150, 250, 350 and 450 are further connected to the EOR elements 101, 201, 301 and 401, respectively. Each of the switching elements is connected to its associated EOR element in such a manner that the switching element 111 is connected to the EOR 101 and the element 211 to the EOR 201, for example. The thus formed EOR array 2 is programmable to attain a given function by controlling the ON or OFF states the switching elements 111 to 114, 211 to 214, 311 to 314 and 411 to 414.

The truth table of each EOR element is as shown in the following table.

| INPUT | | OUTPUT |
|---|---|---|
| a | b | c |
| 0 | 0 | 0 |

-continued

| INPUT | | OUTPUT |
|---|---|---|
| a | b | c |
| 0 | 1 | 1 |
| 1 | 0 | 1 |
| 1 | 1 | 0 |

The operation of the PLA will be described next on the condition that predetermined switching elements are set to give the above-mentioned function. More clearly, when the switching element 212 is in the ON state, its associated EOR element 202 receives an EOR signal from the preceding EOR element 201 and an AND signal of the AND array 1 through the line 22 with the result that an EOR signal in accordance with the above-mentioned truth table may be produced. Conversely, when the switching element 212 is in the OFF state, the EOR element 202 produces an output signal which is the same as the output signal from the preceding EOR element 201. In other words, a logical "0" is always applied from the switching element 212 to the EOR element 202, regardless of the AND signal on the line 22. The logic constant elements 150, 250, 350 and 450 are comprised of semiconductor switching elements each providing either the logical state "1" or "0". For example, if the logical constant element 250 is in the "1" state, the logical "1" is constantly applied to the EOR element 201. The output signal lines 31 to 34 serve as the output signal lines of the PLA and of the EOR array. The signals appearing on the output signal lines 31 to 34 are the EOR signals obtained as a result of the switching control of the switching elements by the signal lines 21 to 24.

Figure 2:
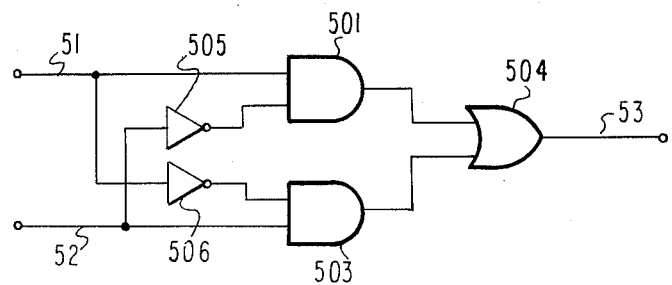
FIG. 2 shows a circuit diagram of an EOR element in the embodiment of FIG. 1.

Turning now to FIG. 2, each of the EOR elements of FIG. 1 is composed of a couple of inverters 505 and 506, a couple of AND gates 501 and 503 and an OR gate 504. In this circuit, when input signals appearing on signal lines 51 and 52 are either "1" and "1" or "0" and "0", respectively, the circuit produces an output signal "0", while an output signal "1" is produced when said input signals are either "0" and "1" or "1" and "0", respectively.

A description will now be given of how the following Boolean equation is physically implemented by the present PLA.

$$y1 = x1 \cdot \overline{x3} + \overline{x1} \cdot x2 + x1 \cdot \overline{x2}$$

$$y2 = x1 \cdot \overline{x2} + \overline{x1} \cdot x3 + x1 \cdot \overline{x3} \qquad (1)$$

where x1 to x3 are input variables and y1 and y2 are output variables. For a better understanding of the invention, an example of how the equation (1) is attained using a conventional PLA will first be given referring to FIG. 3. An AND array 3 includes a plurality of input signal lines 31 to 33 for receiving input variables x1 to x3, a plurality of output signal lines 34 to 37 to produce AND signals x1·x3, x1·x2, x1·x2 and x1·x3, and a plurality of diodes 301 to 308 for coupling the input signal lines 31 to 33 with the output signal lines 34 to 37. An OR array 4 comprises a plurality of input signal lines connected to the output signal lines 34 to 37 of the AND array 3, a plurality of output signal lines 41 and 42 and a plurality of diodes for coupling the input signal lines with the output signal lines at the intersections therebetween so as to carry out the OR operation of the AND signals x1·$\overline{x3}$, $\overline{x1}$·x2, x1·$\overline{x2}$, and $\overline{x1}$·x3. In this case, produced from the output signal lines 41 and 42 are x1·$\overline{x3}$+$\overline{x1}$·x2+x1·$\overline{x2}$ and x1·$\overline{x3}$+x1·$\overline{x2}$+$\overline{x1}$·x3. In this way, the equation (1) is achieved by the use of the conventional PLA.

To achieve the equation (1) by using the present PLA, the equation (1) is rewritten using EOR operations as follows:

$$y1 = x1 \oplus x2 \oplus x1 \cdot x2 \oplus x1 \cdot x2 \cdot x3$$

$$y2 = x1 \oplus x3 \oplus x1 \cdot x3 \oplus x1 \cdot x2 \cdot x3 \qquad (2)$$

where symbol $\oplus$ indicates the EOR operation. The equation (2) is called the Reed-Muller's Expansion which is obtained from the Boolean AND-OR equation (1) through the following two steps and from a few elementary principles of Boolean algebra.

Step 1: If the AND of two AND terms in the equation (1) is "0", the function remains unchanged even if OR symbol "+" is replaced by EOR symbol "$\oplus$".

Step 2: Delete all the negation terms by using an equivalence $\overline{x_i} = x_i \oplus 1$.

For example, employing the known principles of Boolean algebra $$a + \overline{a} \cdot b = a + b$$

$$a \cdot \overline{a} = 0$$

$$\overline{(a \cdot b)} = \overline{a} + \overline{b},$$

equation (1) can be transformed as follows:

$$\begin{aligned}
y1 = & (x1 \cdot \bar{x}3) + (\bar{x}1 \cdot x2) + (x1 \cdot \bar{x}2) = [(x1 \cdot \bar{x}2) + (x1 \cdot \bar{x}3)] + \\
& (\bar{x}1 \cdot x2) = [(x1 \cdot \bar{x}2) + \overline{(x1 \cdot \bar{x}2)} (x1 \cdot \bar{x}3)] + (\bar{x}1 \cdot x2) = \\
& \overline{(x1 \cdot \bar{x}2)} \cdot (x1 \cdot \bar{x}3) + (\bar{x}1 \cdot x2) + (x1 \cdot \bar{x}2) = x1 \cdot \bar{x}3 \, \overline{(x1\bar{x}2)} + \\
& \bar{x}1 \cdot x2 + x1 \cdot \bar{x}2 = x1 \cdot \bar{x}3(\bar{x}1 + x2) + \bar{x}1 \cdot x2 + x1 \cdot \bar{x}2 = \\
& x1 \cdot \bar{x}1 \cdot \bar{x}3(=0) + x1 \cdot x2 \cdot \bar{x}3 + \bar{x}1 \cdot x2 + x1 \cdot \bar{x}2 = x1 \cdot x2 \cdot \bar{x}3 + \\
& \bar{x}1 \cdot x2 + x1 \cdot \bar{x}2 \\
y2 = & (x1 \cdot \bar{x}2) + (\bar{x}1 \cdot x3) + (x1 \cdot \bar{x}3) = [(x1 \cdot \bar{x}2) + (x1 \cdot \bar{x}3)] + \\
& (\bar{x}1 \cdot x3) = [(x1 \cdot \bar{x}2) + \overline{(x1 \cdot \bar{x}2)} (x1 \cdot \bar{x}3)] + (\bar{x}1 \cdot x3) = \\
& x1 \cdot \bar{x}2 + \bar{x}1 \cdot x3 + x1 \cdot \overline{\bar{x}3(x1 \cdot \bar{x}2)} = x1 \cdot \bar{x}2 + \bar{x}1 \cdot x3 + \\
& x1 \cdot \bar{x}3(\bar{x}1 + x2) = x1 \cdot \bar{x}2 + \bar{x}1 \cdot x3 + x1 \cdot x2 \cdot \bar{x}3 + x1 \cdot \bar{x}1 \cdot \bar{x}3(=0)
\end{aligned}$$

$$= x1 \cdot \bar{x}2 + \bar{x}1 \cdot x3 + x1 \cdot x2 \cdot \bar{x}3.$$

These equations for y1 and y2 can then be transformed in accordance with the step 1 as follows:

$$y1 = x1 \cdot x2 \cdot \bar{x}3 \oplus \bar{x}1 \cdot x2 \oplus x1 \cdot \bar{x}2$$

$$y2 = x1 \cdot \bar{x}2 \oplus \bar{x}1 \cdot x3 \oplus x1 \cdot x2 \cdot \bar{x}3 \quad (3)$$

These are further changed depending on the step 2 as follows:

$$y1 = x1 \cdot x2 \cdot (x3 \oplus 1) \oplus (x1 \oplus 1) \cdot x2 \oplus x1 \cdot (x2 \oplus 1)$$

$$y2 = x1 \cdot (x2 \oplus 1) \oplus (x1 \oplus 1) \cdot x3 \oplus x1 \cdot x2 \cdot (x3 \oplus 1) \quad (4)$$

Applying the distributive law to the above equation (4), the following equation is obtained:

$$y1 = x1 \oplus x2 \oplus x1 \cdot x2 \oplus x1 \cdot x2 \cdot x3$$

$$y2 = x1 \oplus x3 \oplus x1 \cdot x3 \oplus x1 \cdot x2 \cdot x3 \quad (5)$$

The above equation (5) is the same as the equation (2).

FIG. 4 shows a detailed circuit diagram of the present PLA according to the equation (2). In the figure, reference numeral 5 represents an AND array and numeral 6, an EOR array. The AND array 5 has input signal lines 43 to 45 for receiving input variables x1, x2 and x3, a plurality of AND signal lines 54 to 59 for outputting the AND signals x1, x2, x3, x1·x2, x1·x3 and x1·x2·x3 of the input variables x1 to x3, and a plurality of diodes 511 to 520 so connected to the input signal lines and the AND signal lines as to satisfy the AND term of the equation (2).

The EOR array 6 has a plurality of input signal lines 54 to 59 arranged in the column direction and permitting the AND signals to pass therethrough, a plurality of signal lines 69 and 70 arranged in the row direction and permitting logical constant signals to pass therethrough, output lines 74 and 78 for producing EOR signals of given combinations of signals delivered through the signal lines 54 to 59, 69 and 70, and EOR elements 61 to 68 disposed to satisfy the EOR term of the equation (2). More specifically the EOR element 61 is connected to the logical constant "0" signal line 69 and the signal line 54 coupled to the AND array 5 and produces an EOR signal x1 through an output line 71. The EOR element 62 is connected to the output line 71 coupled to the EOR element 61 and the signal line 55 coupled to the AND array 5, and produces and EOR signal x1+x2 through the output signal line 72. In a similar manner, the EOR element 63 produces an EOR signal $x1 \oplus x2 \oplus x1 \cdot x2$ through an output line 73, and the EOR element 64 produces an EOR signal $x1 \oplus x2 \oplus x1 \cdot x2 \oplus x1 \cdot x2 \cdot x3$ through an output line 74. The EOR element 65 located at the intersection of the first column and the second row is coupled with the logical constant "0" signal line 70 and signal line 54 for input signal reception and is further coupled to an output line 75 for transmitting an EOR signal x1. The EOR element 66 disposed at the third column and the second row is connected for input signal reception to the output line 75 and the signal line 56 permitting the AND signal $x1 \oplus x3$ to pass therethrough from the AND array 5, and further is connected to an output line 76 for sending out an EOR signal $x1 \oplus x3$. Likewise, the EOR elements 67 and 68 produce EOR signals $x1 \oplus x3 \oplus x1 \cdot x3$ and $x1 \oplus x3 \oplus x1 \cdot x3 \oplus x1 \cdot x2 \cdot x3$ through output lines 77 and 78, respectively.

Comparing the equations (1) and (2), the AND-OR equation (1) includes a negation variable $\bar{xi}$ in the AND term while the logical equation (2) of the Reed-Muller Expansion includes none of the negation variables $\bar{xi}$. For this reason, the detection of the structural elements used is performed with the conventional PLA array of FIG. 3 as follows: In order to determine that none of the cross points in the OR array 4 is stuck in the "0" state combinations of (x1, x2, x3) must be provided such that only one diode at a time on each of lines 41 and 42 is forward biased. Further, in order to determine that none of the diodes is stuck in a forward bias state, combinations of (x1, x2, x3) must be supplied such that all output lines 34–37 are in a "0" state.

Therefore, test data combinations of (x1, x2, x3) equal to (1,1,0), (0,1,0), (1,0,0), (0,0,1) and (0,0,0) must be prepared for those purposes. Generally, since the number of the necessary test data combinations is determined on the basis of the kind and the number of the signal lines 31 to 37, the number of test data combinations increases in direct proportion to the number of the AND element used, and a lot of time is required for the determination of the proper test data combinations.

On the other hand, in the present PLA shown in FIG. 4, only four test data combinations are necessary to determine that all of the EOR operators 61–68 are functioning properly. More specifically, when the states of the two constant supply elements at the left end of the EOR array 6 are c1 and c2, the required test data combinations of (c1, c2, x1, x2, x3) are (0,0,0,0,0), (0,0,1,1,1), (1,1,0,0,0), (1,1,1,1,1).

In other words, in the case where the states of all the constant supply elements are "0" or "1", the necessary test data may be formed be merely rendering all the signals on the lines 54 to 59 "0" or "1". As described above, no negation variable is included in the signals on the lines 54 to 59. This means that all the input variables x1, x2 and x3 are made "0" or "1". Therefore, when no failure is found in the AND array 5, the outputs (y1, y2) for the test data (0,0,0,0,0), (0,0,1,1,1), (1,1,0,0,0) and (1,1,1,1,1) are (0,0), (0,0), (1,1) and (1,1), respectively.

If the AND array 5 suffers from the "0" fixed failure), i.e., if one of the output lines 54–59 is stuck in a "0" state, the outputs (y1,y2) for test data (0,0,1,1,1) will be any one of (0,1), (1,0), (1,0), and (1,1), and this is different from the normal output with the result that the "0" fixed failure can be detected. On the other hand, if the AND array 5 suffers from the "1" fixed failure, i.e., any one of lines 54–59 is stuck in a "1" state, the (y1,y2) output for test data (0,0,0,0,0) will be any one of (0,1), (1,0), or (1,1). Similarly, the "0" and "1" fixed failures in the FOR array 6 are detected by observing outputs (y1,y2) for the four test data different from that at the normal state.

As described above, since each of the four test data combinations needed for the present PLA has a given input pattern regardless of array size, the complicated calculation needed for the conventional PLA is no longer necessary. The determination of these test data is discussed in detail in a paper by SUDHAKAR M. REDDY entitled "Easily Testable Realization for Logic Functions" published in "IEEE Transactions on Computers", Vol. C-21, No. 11, November 1972, pp. 1183 to 1188.

Turning now to FIG. 5, another embodiment of the present PLA comprises an AND array 5 and an EOR array 6' including EOR elements 611 to 614 and 711 to 714 arranged in an array to realize the equation (2) as in the case of the array shown in FIG. 4. The distinctive feature of this embodiment lies in the EOR elements being arranged in a tree-like fashion to shorten the signal propagation speed. More particularly, the EOR element 611 is connected to signal lines 54 and 55 derived from the AND array 5 and produces an EOR signal $X1 \oplus X2$ through an output line 615. The EOR element 614 is connected to the signal lines 57 and 59 from the AND array 5 and produces an EOR signal $X1 \cdot X2 \oplus X1 \cdot X2 \cdot X3$ through an output line 616. The EOR element 613 is connected to the output lines 615 and 616 and produces an EOR signal $X1 \oplus X2 \oplus X1 \cdot X2 \oplus X1 \cdot X2 \cdot X3$ through an output signal line 617. The EOR element 612 is connected to the output signal line 617 of the EOR element 613 and a logical constant signal line 650 and produces an output signal Y1 through an output signal line 618. Similarly, the EOR element 711 is connected to an output line 715 for delivering an EOR signal $X1 \oplus X3$ therethrough. The EOR element 714 produces an output signal $X1 \cdot X3 \oplus X1 \cdot X2 \cdot X3$ of EOR. The EOR element 712 produces an EOR signal $X1 \oplus X3 \oplus X1 \cdot X3 \oplus X1 \cdot X2 \cdot X3$ through an output line 717. The EOR element 713 produces an output signal Y2 of the EOR array 6' through an output signal line 718. As a result, the signal propagation delay from the input to the output of the EOR array shown in FIG. 5 corresponds to that of only three stages of EOR elements compared to four in the EOR array of FIG. 4. Also, the diode elements are disposed at the intersections in the AND array to facilitate the mass production of the arrays, however, it should be realized that other suitable elements may be used in place of the diodes.

What is claimed is:

1. A programmable logic array comprising:
a logical product (AND) term generator having row and column lines arranged on a semiconductor surface in row and column directions and a plurality of AND elements disposed at the intersections of said row and column lines, said AND term generator being programmable to provide output signals on its column lines which are a given function of input signals on its row lines; and
an Exclusive OR (EOR) term generator having a plurality of logic constant signal lines and a plurality of EOR elements, each of said logic constant signal lines being externally supplied with logic constant signals and each of said logic constant signal lines being coupled to said logical product term generator output signals through a plurality of said EOR elements, said EOR term generator having output lines each of which is coupled to the output of one of said plurality of EOR elements and on which are provided signals corresponding to EOR sums of various combinations of said input signals.

2. A programmable logic array according to claim 1, wherein there are a plurality of EOR elements coupled to each logic constant signal line, each of said EOR elements having at least first and second inputs and an output, and each of said plurality of EOR elements coupled to any one logic constant signal line having its first input coupled to a respective column line of said AND term generator, a first of said EOR elements coupled to each logic constant signal line receiving one of said externally supplied logic constant signals as its second input, the remainder of said plurality of EOR elements coupled to said one logic constant signal line receiving an output from a previous EOR element as a second input, and the output of the last of said remainder of EOR elements being coupled to one of said EOR term generator output lines.

3. A programmable logic array claimed in claim 2, in which said EOR term generator further comprises a plurality of switching elements each of which is connected between a column line of said AND term generator and one of said Exclusive OR elements determining whether output signals in the column direction delivered from said AND term generator are applied to said Exclusive OR elements.

4. A programmable logic array according to claim 1, wherein said plurality of EOR elements coupled to each logic constant signal line in said EOR term generator includes a plurality of first EOR elements for taking the EOR sum of different pairs of said AND term generator output signals, at least one second EOR element for taking the EOR sum of the outputs from said first EOR elements and a third EOR element for taking the EOR sum of the output of said second EOR element and a logic constant signal, the output of said third EOR element being coupled to one of said EOR term generator output lines.

* * * * *

UNITED STATES PATENT AND TRADEMARK OFFICE
CERTIFICATE OF CORRECTION

PATENT NO. : 4,249,246
DATED : February 3, 1981
INVENTOR(S) : Nanya et al

It is certified that error appears in the above—identified patent and that said Letters Patent is hereby corrected as shown below:

Column 2, line 60 - After "states" insert --of--.

Column 4, line 10 - Delete "x1·x3, x1·x2, x1·x2 and x1·x3" insert --x1·$\overline{x3}$, $\overline{x1}$·x2, x1·$\overline{x2}$ and $\overline{1x}$·x3--

Column 5, line 51 - After "produces" change "and" second occurrence to -- an --.

Column 6, line 6 - Delete "x1·x2.x3" insert --x1·x2·x3-- line 41 - After "formed" change "be" to --by--.

line 49 - After "failure" delete " ) "
In application page 11, line 29 line 59 - Delete "FOR" insert --EOR--
Error in application page 12, line 8.

Signed and Sealed this

*Fourteenth* Day of *July 1981*

[SEAL]

*Attest:*

GERALD J. MOSSINGHOFF

*Attesting Officer*  *Commissioner of Patents and Trademarks*